US012382732B2

(12) United States Patent
Aliane et al.

(10) Patent No.: US 12,382,732 B2
(45) Date of Patent: Aug. 5, 2025

(54) PASSIVATED PHOTODIODE COMPRISING A FERROELECTRIC PERIPHERAL PORTION

(71) Applicant: Commissariat à l'Energie Atomique et aux Energies Alternatives, Paris (FR)

(72) Inventors: Abdelkader Aliane, Grenoble (FR); Hacile Kaya, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 500 days.

(21) Appl. No.: 17/447,972

(22) Filed: Sep. 17, 2021

(65) Prior Publication Data

US 2022/0093812 A1  Mar. 24, 2022

(30) Foreign Application Priority Data

Sep. 21, 2020 (FR) ..................................... 20 09529

(51) Int. Cl.
*H10F 30/223* (2025.01)
*H10F 39/00* (2025.01)
*H10F 39/18* (2025.01)
*H10F 71/00* (2025.01)

(52) U.S. Cl.
CPC ......... *H10F 30/223* (2025.01); *H10F 39/014* (2025.01); *H10F 39/184* (2025.01); *H10F 71/00* (2025.01)

(58) Field of Classification Search
CPC ...... H10F 71/129; H10F 71/133; H10F 77/30; H10F 77/306; H01L 31/0216; H01L 31/20161; H01L 31/02167
See application file for complete search history.

(56) References Cited

U.S. PATENT DOCUMENTS

| 5,073,010 A * | 12/1991 | Johnson .................. G02F 1/135 349/28 |
| 7,397,101 B1 * | 7/2008 | Masini .................. H10F 30/223 257/656 |
| 10,297,708 B1 * | 5/2019 | Ariyawansa ...... H01L 31/03046 |
| 11,264,425 B2 * | 3/2022 | Ouvrier-Buffet ..... H10F 39/182 |
| 11,830,888 B2 * | 11/2023 | Lo .......................... H10F 39/014 |

(Continued)

FOREIGN PATENT DOCUMENTS

FR  3 089 348 A1  6/2020

OTHER PUBLICATIONS

French Preliminary Search Report issued May 19, 2021 in French Application 20 09529 filed on Sep. 21, 2020, 9 pages (with English Translation of Categories of Cited Documents & Written Opinion).

*Primary Examiner* — Vincent Wall
(74) *Attorney, Agent, or Firm* — Oblon, McClelland, Maier & Neustadt, L.L.P.

(57) ABSTRACT

A photodiode including a detection portion having a doped first region, a doped second region and an intermediate region; a dielectric layer; and a semiconductor peripheral portion. It also includes a ferroelectric peripheral portion located between and in contact with the intermediate layer and the dielectric layer, and located between the first region and the semiconductor peripheral portion and surrounding the first region in the main plane.

8 Claims, 7 Drawing Sheets

(56) References Cited

U.S. PATENT DOCUMENTS

| | | | | |
|---|---|---|---|---|
| 2006/0138593 | A1* | 6/2006 | Kim | H01L 23/5223 |
| | | | | 257/532 |
| 2006/0157733 | A1* | 7/2006 | Lucovsky | H10D 64/691 |
| | | | | 257/E29.151 |
| 2007/0170536 | A1* | 7/2007 | Hsu | H10F 30/2235 |
| | | | | 257/458 |
| 2008/0268615 | A1* | 10/2008 | Allibert | H01L 21/76254 |
| | | | | 438/455 |
| 2009/0032896 | A1* | 2/2009 | Taniguchi | H10F 30/245 |
| | | | | 257/462 |
| 2010/0176420 | A1* | 7/2010 | Yao | H10F 30/24 |
| | | | | 257/187 |
| 2010/0301442 | A1* | 12/2010 | Iwai | H10F 71/121 |
| | | | | 257/E31.128 |
| 2011/0241149 | A1* | 10/2011 | Mazzillo | H10F 77/206 |
| | | | | 257/438 |
| 2014/0048897 | A1* | 2/2014 | Qian | H10F 39/807 |
| | | | | 438/57 |
| 2016/0064439 | A1* | 3/2016 | Or-Bach | H01L 27/14623 |
| | | | | 257/443 |
| 2016/0172396 | A1* | 6/2016 | Masuda | H10F 30/292 |
| | | | | 257/295 |
| 2017/0092801 | A1* | 3/2017 | Moussy | H10F 77/206 |
| 2017/0365636 | A1* | 12/2017 | Mazzillo | H10F 77/206 |
| 2018/0033896 | A1* | 2/2018 | Morimoto | H10F 10/12 |
| 2020/0052146 | A1* | 2/2020 | Ogawa | G01J 5/59 |
| 2020/0168758 | A1* | 5/2020 | Aliane | H10F 71/121 |
| 2020/0176503 | A1* | 6/2020 | Ouvrier-Buffet | H10F 39/028 |
| 2021/0104644 | A1* | 4/2021 | Aliane | H10F 30/222 |
| 2021/0111205 | A1* | 4/2021 | Aliane | H10F 30/223 |
| 2022/0093812 | A1* | 3/2022 | Aliane | H10F 39/184 |
| 2022/0392934 | A1* | 12/2022 | Fukushima | H10F 39/8027 |
| 2023/0197879 | A1* | 6/2023 | Aliane | H10F 77/122 |
| | | | | 257/184 |
| 2024/0105864 | A1* | 3/2024 | Aliane | H10F 77/122 |
| 2024/0128393 | A1* | 4/2024 | Aliane | H10F 30/2235 |

* cited by examiner

PASSIVATED PHOTODIODE COMPRISING A FERROELECTRIC PERIPHERAL PORTION

TECHNICAL FIELD

The field of the invention is that of photodiodes passivated by a dielectric passivation layer. The invention is applied notably in the field of detecting light radiation belonging for example to the near infrared, the photodiode or photodiodes then being able to be based on germanium.

PRIOR ART

Optoelectronic photodetection devices may comprise an array of passivated photodiodes. The photodiodes then extend in one and the same main plane, between first and second opposing surfaces that are parallel to one another. They then each have a doped first region, for example n-doped and flush with the first surface, and a doped second region, for example p-doped and flush with the second surface. The two doped regions are then separated from one another by an intrinsic intermediate region or a very slightly doped region, for example p-doped. A passivation layer made of a dielectric material covers the first surface in order to limit the contribution of dark current to the electric current measured by each photodiode.

However, it appears that the presence of the dielectric passivation layer may still contribute to generating a non-negligible dark current. Thus, the article by Sood et al. entitled Characterization of SiGe-Detector Arrays for Visible-NIR Imaging Sensor Applications, Proc. of SPIE VOL. 8012, 801240, 2011, describes a method for producing a passivated photodiode in order to limit dark current. Dark current is linked to the presence of a depleted zone situated in the semiconductor material of the photodiode, at the interface with the dielectric passivation layer. The production method then comprises a step of annealing the photodiode under $N_2H_2$, making it possible to transform this depleted zone into a hole accumulation zone. This step then makes it possible to reduce the intensity of the dark current.

However, it appears that this annealing step, which is intended to change the depleted zone into an accumulation zone, may degrade the performance of the photodiode, notably due to an undesired modification of the dimensions of the n-doped first region, in particular when the lateral diffusion of the n-type doping elements is significant. Moreover, the presence and the characteristics of the depleted zone may be linked to the technique used to deposit the dielectric passivation layer as well as to the operating conditions. As a result, the annealing in question may then not make it possible to reproducibly obtain the desired accumulation zone and thus the desired reduction of the dark current.

Additionally, document EP3657556A1 describes one example of a passivated photodiode based on germanium comprising a p-doped peripheral region surrounding the n+-doped well and flush with the germanium face covered by the dielectric passivation layer. This peripheral region notably makes it possible to reduce the dark current by limiting the surface component of the dark current.

Also known is document EP3660930A1 which describes another example of a passivated photodiode based on germanium. The passivation layer is not made of a dielectric material but is based on silicon. An anneal is carried out to bring about interdiffusion of the silicon from the passivation layer and the germanium of the detection layer. Thus, the n+-doped well is surrounded by a peripheral zone based on SiGe which forms a "gap opening" allowing the surface component of the dark current to be limited.

However, there is a need to provide another solution that makes it possible to reduce the dark current in a passivated photodiode and notably its surface component.

DISCLOSURE OF THE INVENTION

The objective of the invention is to at least partially remedy the drawbacks of the prior art, and more particularly to provide a passivated photodiode that makes it possible to achieve a low dark current, and notably its surface component.

To that end, the subject of the invention is a photodiode having a first surface and a second surface that are opposite one another and parallel to a main plane, comprising:
 a detection portion, made of a semiconductor material, comprising:
  a first region that is doped with a first conductivity type and is flush with the first surface, and is intended to be electrically biased;
  a second region that is doped with a second conductivity type opposite the first type, and is flush with the second surface;
  an intermediate region, located between the first region and the second region;
 a dielectric layer, covering the detection portion on the first surface and coming into contact with the first region; and
 a semiconductor peripheral portion made of a semiconductor material doped with the second conductivity type, intended to be electrically biased, and surrounding the detection portion in the main plane and coming into contact with the second region.

According to the invention, the photodiode further comprises a ferroelectric peripheral portion, made of a ferroelectric material, located between and in contact with the intermediate region and the dielectric layer, and located between the first region and the semiconductor peripheral portion and surrounding the first region in the main plane.

Some preferred but non-limiting aspects of this photodiode are the following.

The ferroelectric peripheral portion may be laterally in contact with the first region on one side, and with the semiconductor peripheral portion on the other side.

The detection portion may have a peripheral indentation (peripheral recess) delimiting a protruding part surrounded by the ferroelectric peripheral portion in the main plane.

The detection portion may be based on germanium, and the peripheral semiconductor portion may be based on silicon.

The ferroelectric peripheral portion may be based on a material chosen from among PZT, PLZT, BT, PT, PLT, PVDF, and from among $HfO_2$, ZnO, and AlN.

The dielectric layer may be passed through by a central metallization that comes into contact with the first region, and by a lateral metallization that comes into contact with the semiconductor peripheral portion.

The photodiode may comprise a peripheral electrode extending over the dielectric layer and in contact with the lateral metallization, surrounding the first region, and located vertically in line with the ferroelectric peripheral portion.

The invention also pertains to an array of photodiodes, comprising a plurality of photodiodes according to any one of the preceding features, in which upper surfaces of the first regions opposite the second regions are coplanar, and the second surfaces are coplanar.

The invention also pertains to an optoelectronic device comprising an array of photodiodes according to any one of the preceding features, and a control chip hybridized with the array of photodiodes, designed to reverse-bias the photodiodes.

The invention also pertains to a method for producing a photodiode according to any one of the preceding features, comprising the following steps:

producing a stack comprising a first sublayer that is doped to the second conductivity type and intended to form the second region, covered with a second sublayer that is intended to form the intermediate region;

depositing an upper insulating layer on the second sublayer;

producing the semiconductor peripheral portion extending through the upper insulating layer and the second sublayer, until reaching the first sublayer;

producing a peripheral indentation (ie. a peripheral recess) in the second sublayer, through a peripheral opening surrounding a central portion of the upper insulating layer;

producing the ferroelectric peripheral portion that fills the peripheral indentation;

removing the central portion;

producing the first region in the second sublayer;

depositing the dielectric layer on and in contact with the ferroelectric peripheral portion and the first region.

The method may comprise a step for the crystallization annealing of the material of the ferroelectric peripheral portion, further ensuring diffusion of the doping elements from the semiconductor peripheral portion into the diffusion portion, thereby forming, in the detection portion, a lateral region doped with the second conductivity type.

The detection portion may be based on germanium, and the peripheral semiconductor portion may be based on silicon. The crystallization anneal may further ensure diffusion of the silicon from the semiconductor peripheral portion to the detection portion, thereby forming a lateral zone based on silicon-germanium.

The step of producing the first region may comprise the implantation of doping elements into the second sublayer through the central portion.

The implantation depth may be less than the thickness of the ferroelectric peripheral portion which is in contact, laterally, with a protruding part of the second sublayer delimited by the peripheral indentation. The method may comprise an anneal for activating the doping elements, the ferroelectric peripheral portion laterally blocking the diffusion of said doping elements during this anneal.

BRIEF DESCRIPTION OF THE DRAWINGS

Other aspects, aims, advantages and features of the invention will become more clearly apparent on reading the following detailed description of preferred embodiments thereof, this description being given by way of non-limiting example and with reference to the appended drawings, in which.

DETAILED DISCLOSURE OF PARTICULAR EMBODIMENTS

Figure 1A:
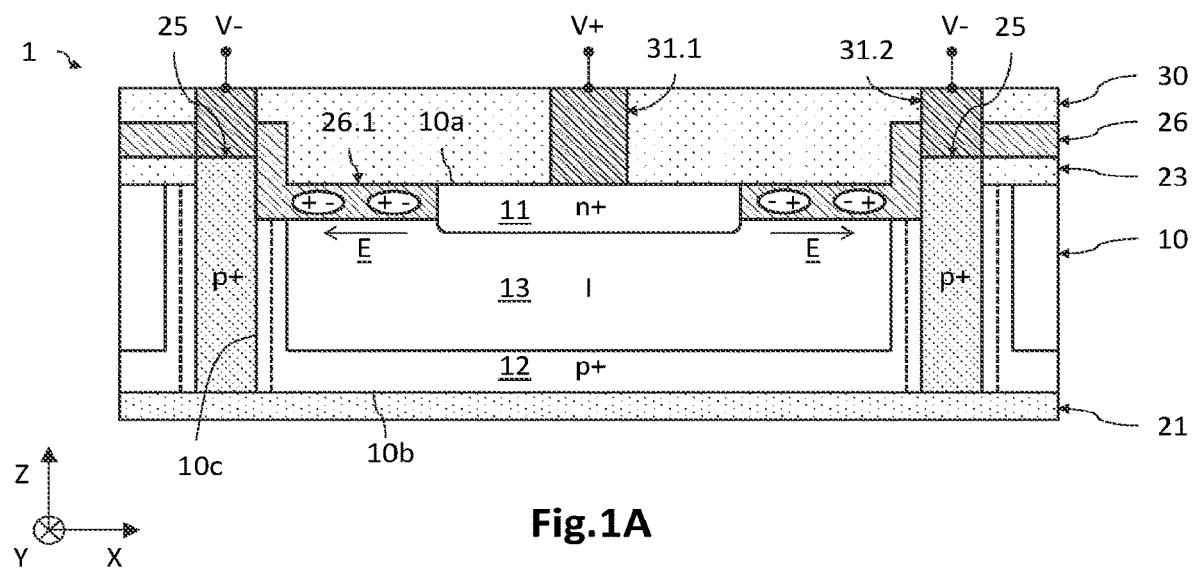
FIG. 1A is a schematic and partial view, in cross section, of a photodiode according to one embodiment, comprising a ferroelectric peripheral portion of which the ferroelectric dipoles are oriented horizontally when the photodiode is biased.

In the figures and in the remainder of the description, the same references represent identical or similar elements. In addition, the various elements have not been shown to scale so as to improve the clarity of the figures. Moreover, the various embodiments and variants are not mutually exclusive and may be combined with one another. Unless otherwise indicated, the terms "substantially", "about" and "of the order of" mean to within 10%, and preferably to within 5%. Moreover, the terms "comprised between . . . and . . . " and equivalents mean that the bounds are included, unless indicated otherwise.

The invention pertains to a passivated photodiode, preferably to an array of photodiodes, and to the production method. Each photodiode is preferably based on germanium and is designed to detect light radiation in the near infrared (SWIR, for Short Wavelength IR) corresponding to the spectral range from 0.8 µm to around 1.7 µm, or even to around 2.5 µm.

The photodiodes have a first surface and a second surface that are opposite one another and parallel to a main plane of the photodiode. These first and second surfaces, referred to as reference surfaces, may be planar, and are common from one photodiode to the next. The photodiodes each have what is called a semiconductor detection portion, within which there is a PN or PIN junction, delimited vertically (along the axis of the thickness) between the first and second reference surfaces. Each photodiode has a first region doped with a first conductivity type, for example n-type, flush with the first surface and forming a doped well, a second region doped with a second conductivity type, for example p-type, flush with the second surface, and an intermediate region situated between the two doped regions and surrounding the doped first region in the main plane. This intermediate region may be doped with the second conductivity type, for example p-type, so as to form a PN junction, or be intrinsic, that is to say not intentionally doped, so as to form a PIN junction.

These photodiodes do not have a mesa structure, insofar as they are optically isolated from one another by peripheral trenches filled with a doped semiconductor material. In addition, the photodiode is referred to as passivated insofar as a surface of the semiconductor detection portion is partly covered by a ferroelectric portion, which is arranged between this semiconductor detection portion and a dielectric layer, allowing the surface component of the dark current of the photodiode to be reduced.

In general, the dark current of a photodiode is the electric current present within the photodiode during operation, when it is not subjected to light radiation. It may be formed of thermally generated currents within the volume of the semiconductor detection portion (diffusion currents, depletion currents, tunnel currents, etc.) and of surface currents.

The surface currents may be related to the presence of electric charges in the dielectric passivation layer mentioned in the article by Sood et al. 2011. Specifically, these electric charges may induce a modification of the curvature of the energy bands close to the surface, leading to the formation of a depleted zone or even of an inversion zone in the detection portion. The depleted zone, when it is situated in the space charge zone of the photodiode, may give rise to stray generation-recombination currents. Moreover, the inversion zone, which is then electrically conductive, may allow electric charges to move between n-doped and p-doped biased regions situated at the interface with the dielectric passivation layer.

Thus, the one or more photodiodes according to the invention comprise, for each photodiode, a peripheral portion made of a ferroelectric material, located between and in contact with the intermediate region and the dielectric layer along an axis orthogonal to the main plane of the photodiode, and surrounding the first region in the main plane. Thus, as explained further on, the surface component of the dark current is reduced, thereby making it possible to improve the performance of the one or more photodiodes. Specifically, this ferroelectric peripheral portion, through the orientation of the ferroelectric dipoles along a favored direction when the photodiode is biased, makes it possible to limit or prevent the formation of a depleted zone or of an inversion zone in the detection portion, and make it possible to prevent the flow of charge carriers through this same ferroelectric peripheral portion, between the doped first region and the doped semiconductor peripheral region.

FIG. 1A is a partial and schematic view, in cross section, of a passivated photodiode 1 belonging to an array of photodiodes, according to one embodiment. In this example, the photodiodes 1 are based on germanium. They are reverse-biased from the side of the first surface 10a, and are optically isolated from one another by trenches filled with a doped semiconductor material.

A three-dimensional direct reference frame (X, Y, Z) is defined here and for the remainder of the description, in which the X and Y axes form a plane parallel to the main plane of the photodiodes 1, and in which the Z axis is oriented along the thickness of the detection portion 10 of the photodiode 1, from the second surface 10b in the direction of the first surface 10a. The terms "lower" and "upper" refer to positions of increasing distance in the +Z direction.

The photodiode 1 has a detection portion 10 extending along the Z axis between a first and a second reference surface 10a and 10b, which are parallel to one another and opposite one another. The first and second surfaces 10a, 10b are common to each photodiode 1 of the array. As described further on, the first surface 10a is defined by the upper face of the first region 11, which is n+-doped, and by a part of the upper face of the ferroelectric peripheral portion 26. The maximum thickness of the detection portion 10, defined along the Z axis between the first and second surfaces 10a, 10b, is substantially constant here from one photodiode to the next; for example, it is between a few hundred nanometers and several microns, for example between approximately 1 μm and 5 μm. The thickness is chosen so as to obtain good absorption in the wavelength range of the light radiation to be detected. The detection portion 10 has a transverse dimension in the XY plane that may be between a few hundred nanometers and a few tens of microns, for example between 1 μm and around 20 μm.

The detection portion 10 is made of at least one crystalline, preferably monocrystalline, semiconductor material. It is moreover based on a chemical element of interest, here based on germanium. Based on is understood to mean that the crystalline semiconductor material corresponds to the chemical element of interest or is an alloy formed of at least the chemical element of interest. The chemical element of interest is advantageously germanium, such that the photodiodes are made of germanium Ge, silicon-germanium SiGe, germanium-tin GeSn, and silicon-germanium-tin SiGeSn. In this example, the detection portion 10 is derived from at least one layer made of the same chemical element of interest, namely in this case from germanium. It may thus be a layer or a substrate made of the same semiconductor material and have regions of different conductivity types (homojunction) so as to form a PN or PIN junction. As a variant, it may be a stack of sublayers of various semiconductor materials (heterojunction), which are then formed based on the chemical element of interest.

The detection portion 10 is thus formed of a first region 11 doped with a first conductivity type, here n-type, which is flush with the first surface 10a and forms an n+-doped well, and a second region 12 doped with a second conductivity type, here p-type, which is flush with the second surface 10b. Flush is understood to mean "reach the level of", or "extends from". An intrinsic intermediate region 13 (in the case of a PIN junction) or one doped with the second conductivity type (in the case of a PN junction) is situated between and in contact with the two doped regions 11 and 12, and surrounds the n-doped first region 11 in the main plane. In this example, the semiconductor junction is of PIN type, the first region 11 being n+-doped, the second region 12 being p+-doped and the intermediate region 13 is intrinsic (not intentionally doped).

The n+-doped first region 11 extends in this case from the first surface 10a and is surrounded by a ferroelectric peripheral portion 26.1 in the main plane, and potentially by the intermediate region 13. It is at a distance from the lateral edge 10c of the detection portion 10 in the plane XY, the lateral edge 10c being defined by the inner face of a p+-doped semiconductor peripheral portion 25. It thus forms an n+-doped well that is flush with the first surface 10a and is spaced by a non-zero distance with respect to the lateral edge 10c as well as the second surface 10b. The n+-doped first region 11 thus contributes to delimiting the first surface 10a. It may exhibit doping that may be between around $10^{17}$ and $10^{21}$ at/cm$^3$.

Figure 1B:
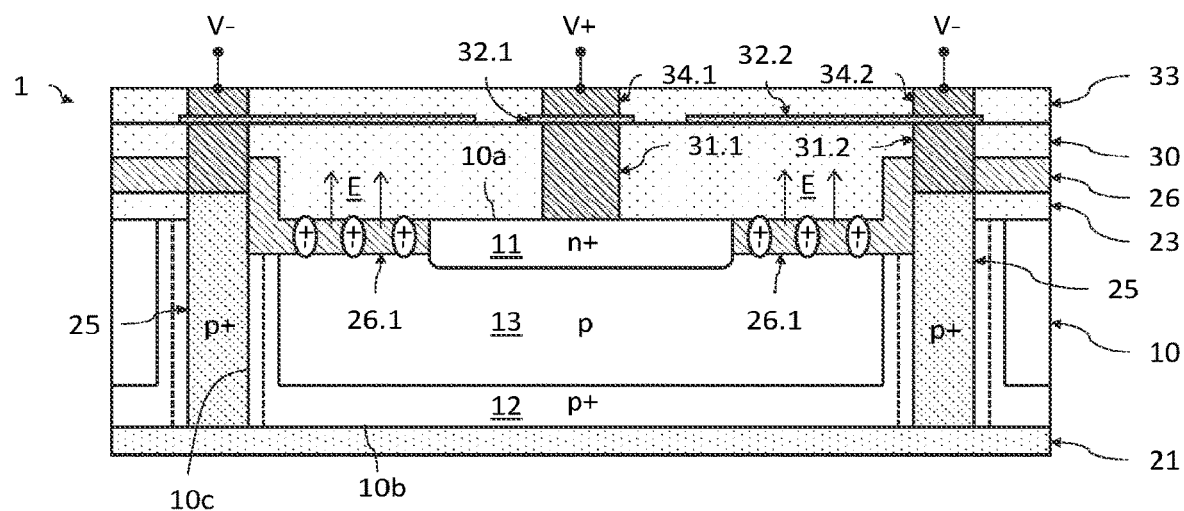
FIG. 1B is a schematic and partial view, in cross section, of a photodiode according to one variant embodiment, comprising a ferroelectric peripheral portion of which the ferroelectric dipoles are oriented vertically when the photodiode is biased.

The second region 12, which is p+-doped here, extends in the XY plane flush with the second surface 10b, here from the lateral edge 10c. It extends along the Z axis from the second surface 10b. It may have a substantially homogeneous thickness along the Z axis and thus be flush only with a lower zone of the lateral edge 10c. As a variant, as illustrated in FIGS. 1A and 1B, the p+-doped second region 12 may have a p+-doped lateral region 14 that is continuously flush with the lateral edge 10c along the Z axis and extends over the entire periphery of the detection portion 10. The p+-doped second region 12 may exhibit doping that may be between around $10^{18}$ and $10^{20}$ at/cm$^3$.

The intermediate region 13 is situated between the two n+-doped and p+-doped regions 11, 12. It may surround the n+-doped first region 11 in the XY plane, and is separated from the first surface 10a and therefore from the dielectric layer 30 by the ferroelectric peripheral portion 26.1. It is made here of an intrinsic semiconductor material so as to form a PIN junction, but may be doped with the second conductivity type, for example p-type, in order to form a PN junction (see FIG. 1B).

The photodiode 1 here has a lower insulating layer 21, made of a dielectric material, covering the second surface 10b of the detection portion 10 and, as described below, the lower surface of the p+-doped semiconductor peripheral portion 25. The lower insulating layer 21 may furthermore be designed to form an anti-reflection function with regard to the incident light radiation. Specifically, it forms the reception surface for the light radiation intended to be detected.

The detection portion 10 of the photodiode 1 is here delimited laterally, in the XY plane, by a preferably continuous trench, filled with a semiconductor material doped with the second conductivity type (here p-type), and forming a p+-doped peripheral semiconductor portion 25. The peripheral through portion 25 contributes to electrically biasing the photodiode 1, here from the side of the first surface 10a, and to pixelating the array of photodiodes (optical isolation). It extends here across the entire thickness of the detection portion 10 to end up at the lower insulating layer 21, but as a variant, it may not end up at the lower insulating layer 21 and may end in the p+-doped second region 12. The inner face of this p+-doped semiconductor peripheral portion 25 then defines the lateral edge 10c of the detection portion 10. The semiconductor material is preferably based on silicon, for example amorphous silicon, polycrystalline silicon, silicon-germanium, or may even be made of amorphous germanium.

The dielectric layer 30 covers the first surface 10a of the photodiode 1, and allows the contacts 31.1 and 32.2 to be electrically insulated. It is thus in contact with the n+-doped first region 11 and with the ferroelectric peripheral portion 26.1. It is made of a dielectric material, such as a silicon oxide, a silicon nitride, or a silicon oxynitride. Other dielectric materials may be used, such as a hafnium oxide or aluminum oxide, or even an aluminum nitride, inter alia. It has a thickness of for example between 50 nm and 500 nm.

However, it appears that the passivation deposition technique that is used may contribute to generating a surface contribution of the dark current when it rests on and in contact with the intermediate region 13. Specifically, as indicated by the article by Sood et al. 2011 mentioned above, the dielectric layer may lead to the formation of a depleted zone in the intermediate region 13 starting from the first surface 10a. When this depleted zone is situated in the space charge zone of the photodiode 1, it may then be the location of a stray generation-recombination current. Moreover, such a dielectric layer may form an inversion zone that is then electrically conductive, which may therefore connect the n+-doped first region 11 to the p+-doped semiconductor peripheral portion.

Thus, each photodiode 1 comprises a peripheral portion 26.1 made of a ferroelectric material, located between and in contact with the intermediate region 13 and the dielectric layer 30, and located between the n+-doped first region 11 and the semiconductor peripheral portion 25 and surrounding the n+-doped first region 11 in the XY plane. The ferroelectric peripheral portion 26.1 is thus in contact with the dielectric layer 30 by an upper face, and in contact with the intermediate region 13 by its lower face.

Surround is understood to mean that the ferroelectric peripheral region 26.1 extends around the n+-doped first region 11 in the main plane, continuously or possibly discontinuously. The ferroelectric peripheral region 26.1 thus extends along the Z axis from the first surface 10a, and surrounds, in the XY plane, the n+-doped first region 11. It is located here in contact with the n+-doped first region 11 (zero spacing), notably when the doping element of the n+-doped first region 11 is phosphorus, which tends to diffuse rapidly, but as a variant might not be in contact therewith (non-zero spacing). It is also located in contact with the p+-doped semiconductor peripheral portion (zero spacing), but as a variant might not be in contact therewith (non-zero spacing).

A ferroelectric material exhibits a spontaneous electrical polarization (or electric dipole moment) which may be oriented by applying an external electric field, here by the electric field generated between the n+-first region 11 and the p+-doped semiconductor peripheral region 25 when the photodiode is (reverse-) biased. The ferroelectric peripheral region 26.1 may be made of a material chosen from among oxides with a perovskite structure, such as, for example, PZT $Pb(Zr,Ti)O_3$, PLZT $(Pb,La)(Zr,Ti)O_3$, BT $BaTiO_3$, PT $PbTiO_3$, PLT $(Pb,La)TiO_3$, polyvinylidene fluoride (PVDF), and from among $HfO_2$, ZnO, AlN, inter alia, and mixtures thereof. The ferroelectric material is preferably chosen from among PZT, BT, PVDF, $HfO_2$, ZnO, AlN, for reasons in particular of ease of use in the method for producing such a photodiode.

Thus, the biasing of the photodiode 1 allows the ferroelectric dipoles present in the ferroelectric peripheral region 26.1 to be oriented in a favored direction, for example in a radial direction in the XY plane or a vertical direction along the Z axis. Thus, this ferroelectric peripheral region 26.1 being located between and in contact with the dielectric layer 30 and with the intermediate region 13 on one side, and surrounding the n+-doped first region 11 in the XY plane on the other side, makes it possible to avoid the presence of a depleted zone or even of an inversion zone in the intermediate region 13 below the first surface 10a. In addition, the orientation of the ferroelectric dipoles in this ferroelectric peripheral region 26.1 makes it possible to block the passage of the charge carriers between the n+-doped first region 11 and the p+-doped semiconductor peripheral portion 25 below the dielectric layer 30, in this same ferroelectric peripheral region 26.1. It therefore provides a lateral electrical insulation function between the n+-doped first region 11 and the p+-doped semiconductor peripheral portion 25 at the level of the first surface 10a, thereby reducing the risk of a short circuit between these parts of the photodiode 1 due, for example, to the inversion zone. The surface components of the dark current are thus reduced, thereby making it possible to improve the performance of the photodiode.

In addition, the presence of this ferroelectric peripheral region 26.1 allows the lateral spacing between the n+-doped first region 11 and the p+-doped semiconductor peripheral portion 25 to be reduced, thereby improving the performance of the photodiode 1. In this way, the situation is avoided in which, in the absence of such a ferroelectric peripheral region 26.1, the photogenerated carriers in the intermediate region 13 close to the first surface 10a are not collected due to insufficient quality of the passivation of this first surface 10a.

Moreover, the detection portion 10 advantageously has a lateral region 14 doped with the second conductivity type, here p+-type, situated at the lateral edge 10c. This lateral region 14 has a doping level higher than that of the intermediate region 13 when it is doped. The p+-doped lateral region 14 is flush with the lateral edge 10c and is in contact with the p+-doped semiconductor peripheral portion 25. The biasing of the p+-doped second region 12 is thus improved in that the contact surface with the p+-doped semiconductor peripheral portion 25 is increased. In addition, this p+-doped lateral region 14 makes it possible to avoid the space charge zone of the photodiode 1 extending to the lateral edge 10c.

The contribution of this region (which is potentially not free from defects related to the production of the trenches) to the dark current is thus limited. The performance of the photodiode 1 is thus improved.

Moreover, the detection portion 10 is based on germanium, for example made of germanium, and the p+-doped semiconductor peripheral portion 25 is based on silicon, for example made of doped polycrystalline silicon. The detection portion 10 then advantageously comprises a lateral zone 15 based on silicon-germanium. The lateral zone 15 is flush with the lateral edge 10c and is in contact with the p+-doped semiconductor peripheral portion 25. The lateral zone 15 thus has a band gap energy greater than that of the detection portion 10 made of germanium. This lateral "gap opening" makes it possible to reduce the sensitivity of the photodiode 1 to defects present near the trenches. The performance of the photodiode 1 is thus also improved.

The photodiode 1 further comprises an electrical circuit for reverse-biasing. In this example, the electrical circuit makes it possible to bias the photodiode 1 from the side of the first surface 10a. The electrical circuit may have contact metallizations 31.1, 31.2 extending through through-openings in the dielectric layer 30 and coming into contact with the n+-doped first region 11 and with the p+-doped semiconductor peripheral portion 25, respectively. The photodiode 1 is intended to be reverse-biased, for example by applying a negative electrical potential to the p+-doped semiconductor peripheral portion 25 and by bringing the n+-doped first region 11 to ground.

In this regard, FIG. 1A illustrates a first electrical blocking configuration referred to as lateral, in which the ferroelectric dipoles are oriented, when the photodiode is reverse-biased, so as to be substantially parallel to the XY plane, in a radial direction going from the n+-doped first region 11 to the p+-doped semiconductor peripheral portion 25. Specifically, the reverse-biasing of the photodiode generates an electric field $\underline{E}$ between the n+-doped first region 11 and the p+-doped semiconductor peripheral portion 25, which orients the ferroelectric dipoles in said radial direction in the XY plane. Thus, this configuration makes it possible in particular to block the passage of the charge carriers at the level of the first surface 10a, in the ferroelectric peripheral portion 26.1, thereby reducing the surface component of the dark current.

The radial spacing, in the XY plane, between the n+-doped first region 11 and the p+-doped semiconductor peripheral portion 25 may be between about 100 nm and 2 μm. A value of between about 100 nm and 200 nm makes it possible to ensure effective lateral electrical blocking while maximizing the fill factor (in the case of an array of photodiodes). The fill factor is defined as the ratio of the area in the XY plane of the detection portion 10 to the area in the XY plane of the photodiode 1 (delimited here by the external face of the p+-doped semiconductor peripheral portion 25).

FIG. 1B is a schematic and partial view of a photodiode according to one variant of the embodiment illustrated in FIG. 1A, illustrating a second electrical blocking configuration, here referred to as vertical. In this configuration, when the photodiode is reverse-biased, the ferroelectric dipoles are oriented vertically, that is to say along the Z axis. For this, the photodiode 1 comprises at least one peripheral planar electrode 32.2, arranged in contact with a peripheral contact metallization 31.2, and extending in an XY plane facing, that is to say vertically in line with, the ferroelectric peripheral portion 26.1, and potentially facing at least part of the n+-doped first portion 11. The peripheral contact metallization 31.2 is that which comes into contact with the p+-doped semiconductor peripheral portion 25.

Thus, the reverse-biasing of the photodiode 1, for example by applying a negative electrical potential to the p+-doped semiconductor peripheral portion 25 and by bringing the n+-doped first portion 11 to ground, generates an electric field $\underline{E}$ between the n+-doped first region 11 on the one hand, and the peripheral planar electrode 32.2 and the p+-doped second region 12 on the other hand, which orients the ferroelectric dipoles along the Z axis. Specifically, the vertical component (along the Z axis) of the electric field $\underline{E}$ at the level of the ferroelectric peripheral portion 26.1 prevails over the horizontal component (in the XY plane) because of the substantial area of the peripheral planar electrode 32.2 which is facing the ferroelectric peripheral portion 26.1 (and potentially part of the n+-doped first portion 11). Thus, this configuration makes it possible to reduce the risk of formation of a depletion zone or even of an inversion zone below the dielectric layer 30 in the intermediate region 13, thereby reducing the surface component of the dark current. In addition, the peripheral planar electrode 32.2 makes it possible to reflect the detection electromagnetic radiation which is initially not absorbed, and therefore makes it possible to increase the sensitivity of the photodiode.

In general, by way of illustration, the photodiode 1 may have dimensions in the XY plane of between about 1 μm and 100 μm. The thickness of the p+-doped second region 12 may be between about 20 nm and 500 nm. The thickness of the intrinsic region 13 may be between about 0.7 μm and 2.5 μm when the photodiode 1 is intended to detect light radiation in the SWIR range or in the near-infrared range (NIR). The n+-doped first region 11 may have a thickness of between about 10 nm and 600 nm. The dielectric layer 30 may have a thickness that allows the entirety of the upper face of the photodiode 1 to be covered and that is, for example, between about 210 nm and 600 nm, and the thickness of the lower insulating layer 21 may be between about 500 nm and 1 μm.

One example of a method for producing an array of photodiodes according to one variant of the embodiment illustrated in FIG. 1A is now described with reference to FIGS. 2A to 2O. In this example, the photodiodes 1 are made of germanium and have a PIN junction, and are designed to detect infrared radiation in the SWIR range. The photodiodes 1 are planar and passivated, and are reverse-biased from the first surface 10a by a control chip hybridized with the array of photodiodes.

Figure 2A:
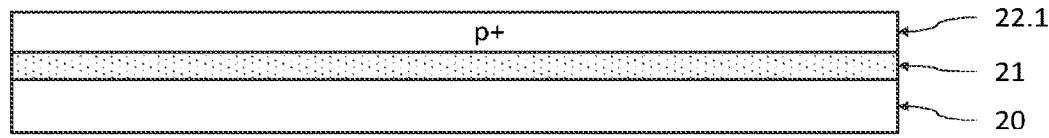
FIGS. 2A to 2O illustrate various steps of a method for producing a photodiode according to the embodiment illustrated in FIG. 1A.

With reference to FIG. 2A, a first monocrystalline germanium semiconductor sublayer 22.1 is produced. The first semiconductor sublayer 22.1 is attached to a support layer 20, here made of silicon, by way of a lower insulating layer 21, here made of a silicon oxide. This stack takes the form of a GeOI substrate (GeOI standing for germanium-on-insulator). This stack is preferably produced by means of the process described in the publication by Reboud et al. entitled *Structural and optical properties of 200 mm germanium-on-insulator (GeOI) substrates for silicon photonics applications*, Proc. SPIE 9367, Silicon Photonics X, 936714 (Feb. 27, 2015). Such a method has the advantage of producing a germanium semiconductor sublayer 22.1 having a complete absence or a low level of structural defects such as dislocations. The germanium may be not intentionally doped or be doped, for example p-doped. The semiconductor sublayer 22.1 may have a thickness of between 100 nm and around 500 nm, for example equal to around 300 nm, and may be covered with a protective layer (not shown) made from a silicon oxide. The lower insulating layer 21 (BOX, for Buried Oxide) may have a thickness of between 50 nm and 1 μm, for example of between 100 nm and 500 nm, and advantageously provides an anti-reflection function.

The first sublayer 22.1 made of germanium is then doped with the second conductivity type, here p-type, by ion implantation of a dopant such as boron or gallium, when the first sublayer 22.1 was initially made of intrinsic germanium. The protective layer, where applicable, has been removed beforehand by surface cleaning, and the first germanium sublayer 22.1 may be coated with a pre-implantation oxide layer (not shown) of a thickness of a few tens of nanometers, for example equal to 20 nm. The germanium sublayer 22.1 then has a dopant density comprised between about $10^{18}$ and $10^{20}$ at/cm$^3$. The dopant may then be diffusion-annealed under nitrogen for a few minutes to a few hours, for example 1 h, at a temperature that may be between 600° C. and 800° C., for example equal to 800° C. This annealing may not be performed when the sublayer 22.1 was doped while growing. Another way of producing this p+layer is by epitaxying a layer of germanium doped with boron in situ between about $10^{18}$ and $10^{20}$ at/cm$^3$ on a sublayer of intrinsic germanium. This epitaxy may be carried out at between 400 and 800° C. but preferably at 400° C.

Figure 2B:
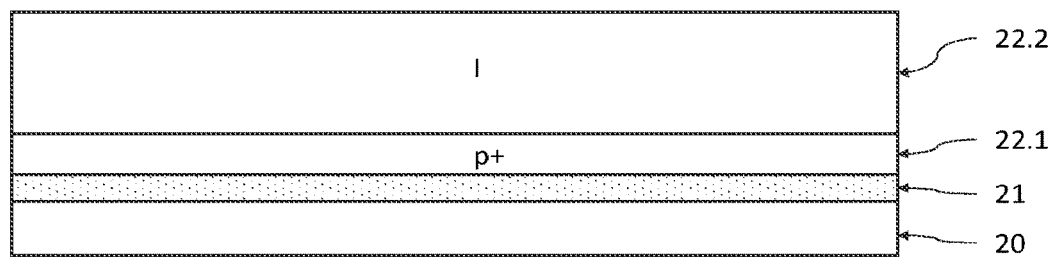

With reference to FIG. 2B, a second germanium semiconductor sublayer 22.2 is produced epitaxially from the first sublayer 22.1. The two sublayers 22.1, 22.2 are intended to form the coplanar germanium detection portions 10 of the array of photodiodes 1. The second sublayer 22.2 is formed epitaxially, for example by chemical vapor deposition (CVD), and preferably by reduced pressure chemical vapor deposition (RPCVD) or by any other epitaxial growth technique. Annealing operations may be performed in order to reduce the dislocation rate in the sublayer 22.2. The pre-implementation oxide layer, where appropriate, will have been removed beforehand by surface cleaning. The second germanium sublayer 22.2 is intrinsic here, that is to say not intentionally doped, insofar as it is desired to produce a PIN junction. It is intended to form the light absorption zone of the photodiodes 1. Its thickness depends on the wavelength range of the light radiation to be detected in the case of a photodiode 1. In the context of SWIR photodiodes, the intrinsic germanium sublayer 22.2 has a thickness for example of between 0.5 μm and 3 μm, preferably equal to 1.5 μm.

Figure 2C:
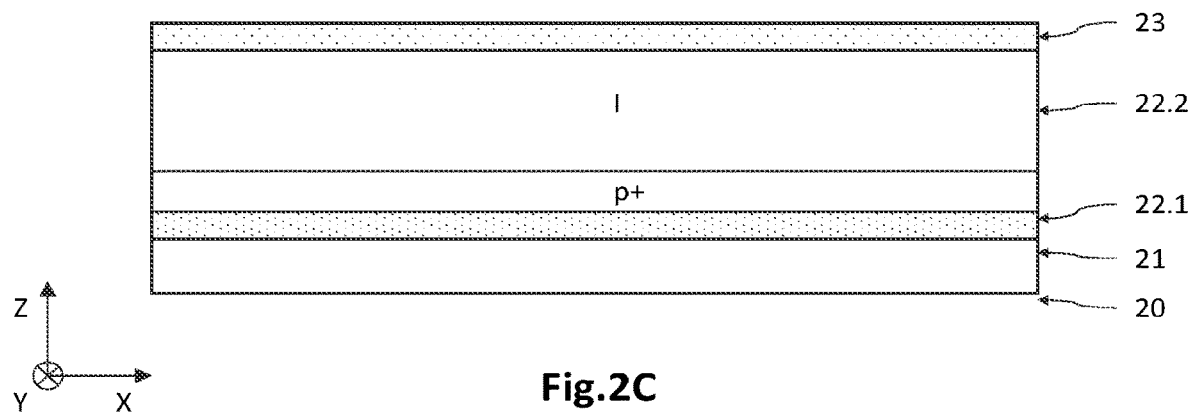

With reference to FIG. 2C, an upper insulating layer 23 is deposited so as to continuously cover the upper face of the second sublayer 22.2, that is to say so as to cover the detection portions 10 of the photodiodes 1. The upper insulating layer 23 is made of a dielectric material, for example a silicon oxide, a silicon nitride or a silicon oxynitride. The upper surface of the second sublayer 22.2 may have been cleaned beforehand. The upper insulating layer 23 may have a thickness of between 10 nm and 600 nm.

Figure 2D:
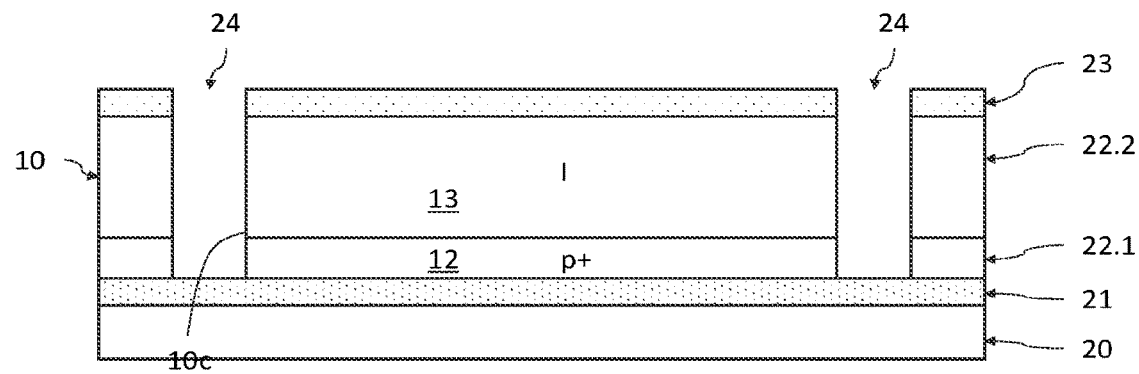

With reference to FIG. 2D, the trenches 24 that are intended to pixelate the photodiodes 1 and to contribute to electrically reverse-biasing them are produced by photolithography and etching. Localized etching of the upper insulating layer 23, of the intrinsic germanium sublayer 22.2 and of the p+-doped germanium sublayer 22.1 is thus performed until they here open onto the upper surface of the lower insulating layer 21 (but the trenches 24 may open onto the sublayer 22.1 without passing through it). Each trench 24 thus preferably extends continuously around a photodiode 1. A plurality of detection portions 10 that are separated from one another by a continuous trench 24 are thus obtained. They are preferably obtained using an anisotropic etching technique, so as to obtain a lateral edge 10c that is substantially vertical along the Z axis. The trenches 24 have a transverse dimension (width) in the XY plane that may be between 300 nm and 2 μm, for example equal to 1 μm. The detection portions 10 may thus have for example a circular, oval, polygonal, for example square, shape in the XY plane, or any other shape.

Figure 2E:
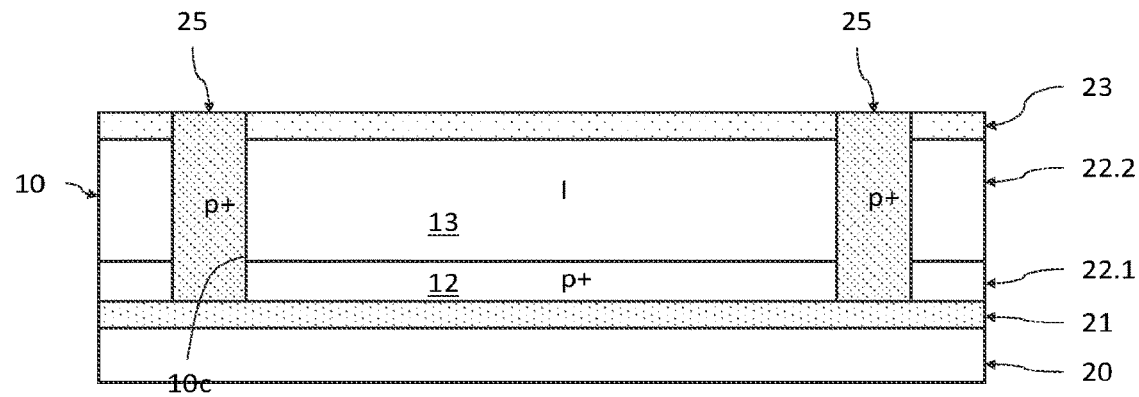

With reference to FIG. 2E, the semiconductor peripheral portions 25 are then produced. For this purpose, a doped semiconductor material is deposited so as to fill the trenches 24. The semiconductor material is preferably a material based on silicon, for example amorphous silicon, polycrystalline silicon, silicon-germanium or even amorphous germanium. The semiconductor material is doped with the second conductivity type, here p-type boron or gallium, with a doping concentration of the order of about $10^{19}$ to $10^{20}$ at/cm$^3$. Thus, the doped semiconductor material comes into contact with the lateral edge 10c by the trench 24. A chemical-mechanical polishing (CMP) step is then performed, with stopping on the upper surface of the upper insulating layer 23, in order to eliminate the excess semiconductor material and planarize the upper surface formed by the upper insulating layer 23 and the semiconductor material of the semiconductor peripheral portion 25. A p+-doped semiconductor peripheral portion 25 in each trench 24 is thus obtained.

Figure 2F:
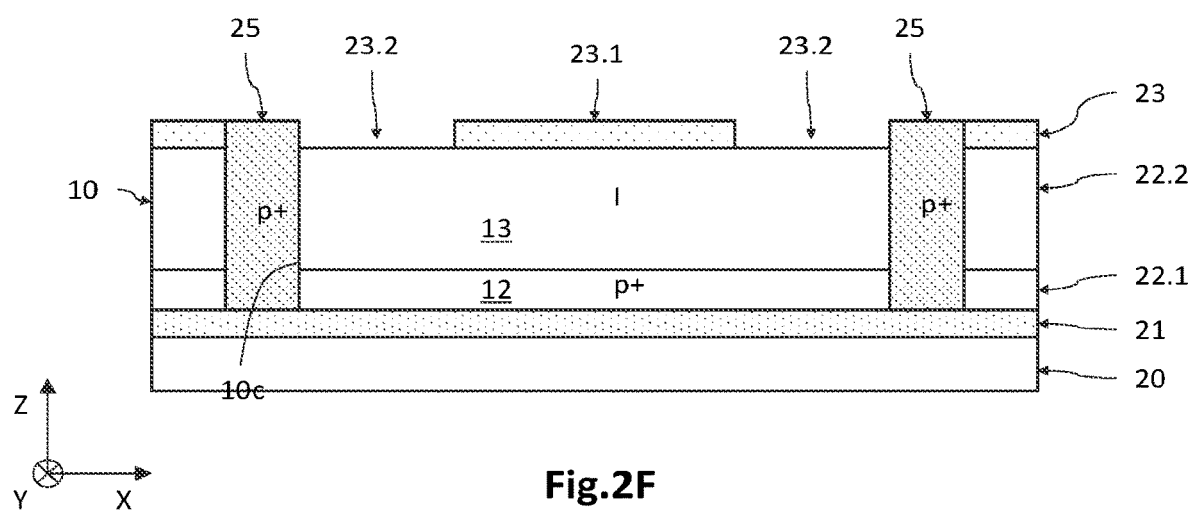

With reference to FIG. 2F, peripheral openings 23.2 are made, by photolithography and etching, in the upper insulating layer 23, which are through-openings so as to open onto the upper face of the intrinsic sublayer 22.2. For each photodiode 1, the peripheral opening 23.2 surrounds, in the XY plane, a central portion 23.1 of the upper insulating layer 23 intended for the later formation of the n+-doped first region 11. The peripheral opening 23.2 has a radial dimension in the XY plane, from the central portion 21.1, which will later define the radial dimension of the ferroelectric peripheral portion 26.1. This radial dimension depends on the size of the photodiode 1. It may be between 100 nm and a few microns. In this example, the peripheral opening 23.2 extends radially in the XY plane until ending up at the inner edge of the p-doped semiconductor peripheral portion 25, but as a variant it might not end up at the p-doped semiconductor peripheral portion 25 and thus remain delimited in the XY plane by the upper insulating layer 23.

Figure 2G:
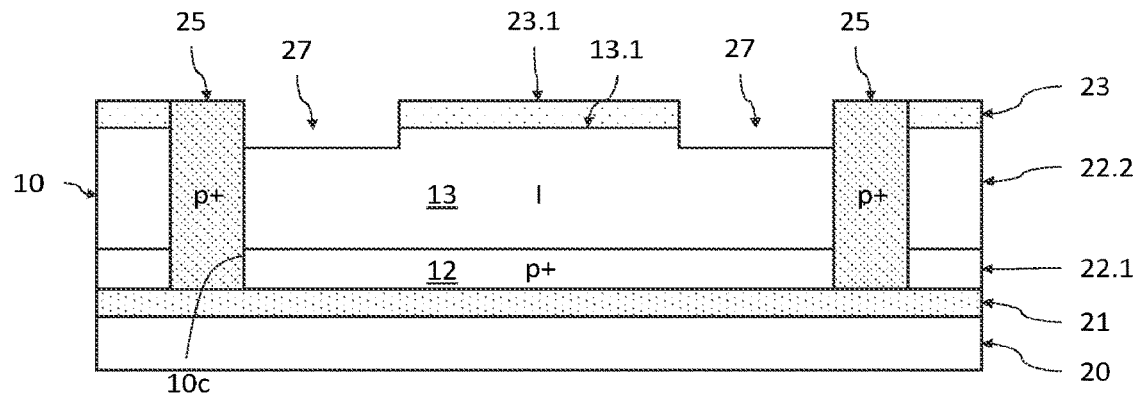

With reference to FIG. 2G, a peripheral indentation 27 is produced by etching in the intrinsic germanium sublayer 22.2, with one and the same radial dimension as the peripheral opening 23.2, and with one and the same depth which advantageously depends on the desired thickness of the n+-doped first region 11 (this depth will make it possible to avoid excessive lateral diffusion of the dopants during the step of producing the n+-doped first region 11). This depth may be between 50 nm and 600 nm, for example equal to 200 nm. Next, surface cleaning of the intrinsic germanium sublayer 22.2 may be carried out. The intermediate region 13 then has a part 13.1 that protrudes in the +Z direction, surrounded by the peripheral indentation 27 in the XY plane, and covered by the central portion 23.1 of the upper insulating layer 23.

Figure 2H:
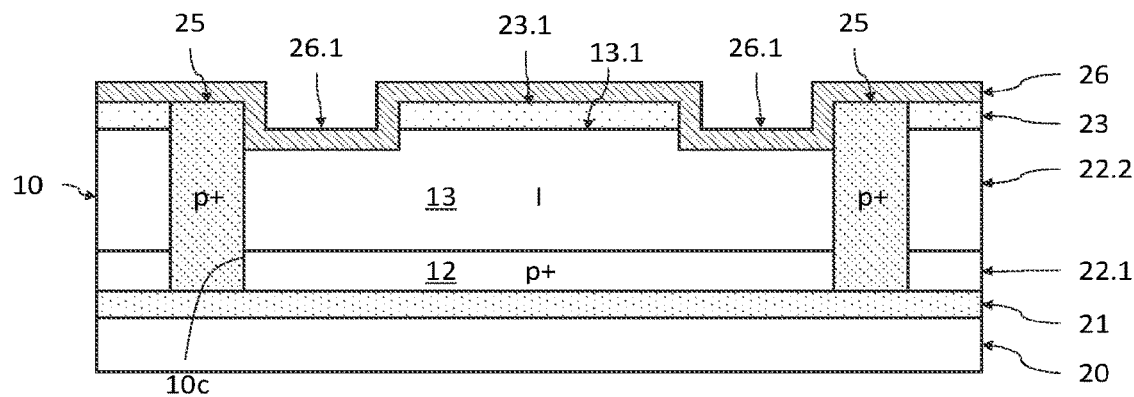

With reference to FIG. 2H, a layer 26 made of a ferroelectric material is deposited so as to fill the peripheral indentations 27 (also called peripheral recesses). This ferroelectric layer 26 has a thickness that is at least equal to the depth of the peripheral indentations 27. It therefore continuously covers the upper insulating layer 23 (in particular the central portion 23.1) and the upper face of the semiconductor peripheral portion 25, and the free surface of the germanium sublayer 22.2 in the peripheral indentations 27. The ferroelectric peripheral portion 26.1 is the part of the layer 26 which is located in the peripheral indentation 27, in contact with the germanium of the sublayer 22.2 (therefore of the intermediate region 13). It surrounds, in the XY plane, the protruding portion 13.1 of the intermediate region 13.

Figure 2I:
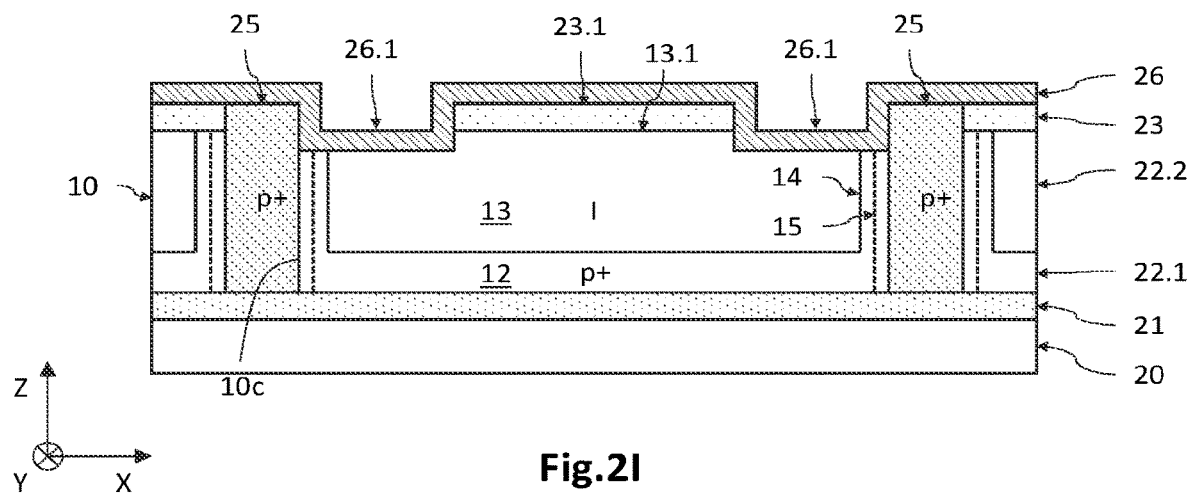

With reference to FIG. 2I, a crystallization anneal of the ferroelectric material is then carried out, for example at a temperature of between 500° C. and 750° C. for 5 to 30 minutes. This anneal also allows the formation of the p+-doped lateral regions 14 through diffusion of the doping elements from the p+-doped semiconductor peripheral portions 25 to the intermediate region 13. Moreover, at the same time, the lateral zone 15 with a gap opening is formed by interdiffusion between the germanium of the detection portion 10 and the silicon of the semiconductor peripheral portion 25.

Figure 2J:
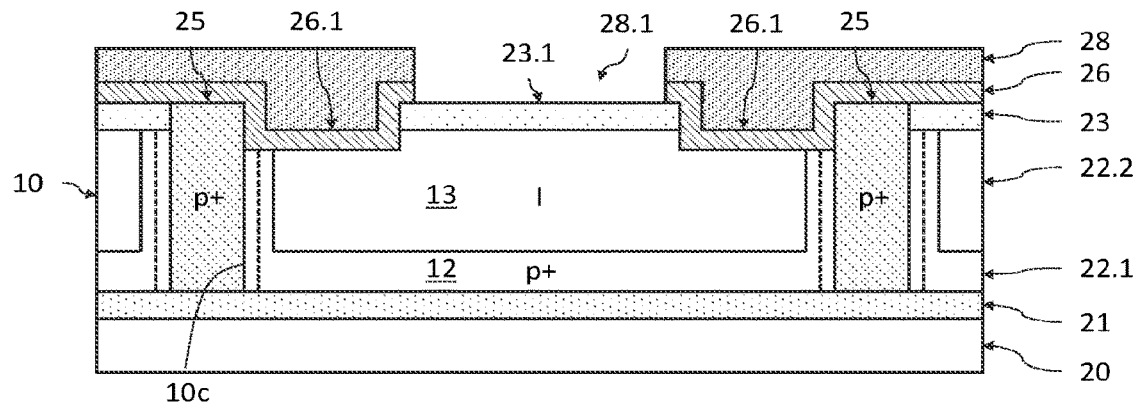

With reference to FIG. 2J, a photoresist mask 28 is deposited with a view to producing the n+-doped first portion 11. This mask 28 has an opening 28.1 that is intended for the implantation of n-type dopants into the germanium of the intermediate region 13. Etching of the part of the ferroelectric layer 26 located at the level of this implantation opening 28.1 is carried out so as to free a surface of the central portion 23.1 of the upper insulating layer 23.

Figure 2K:
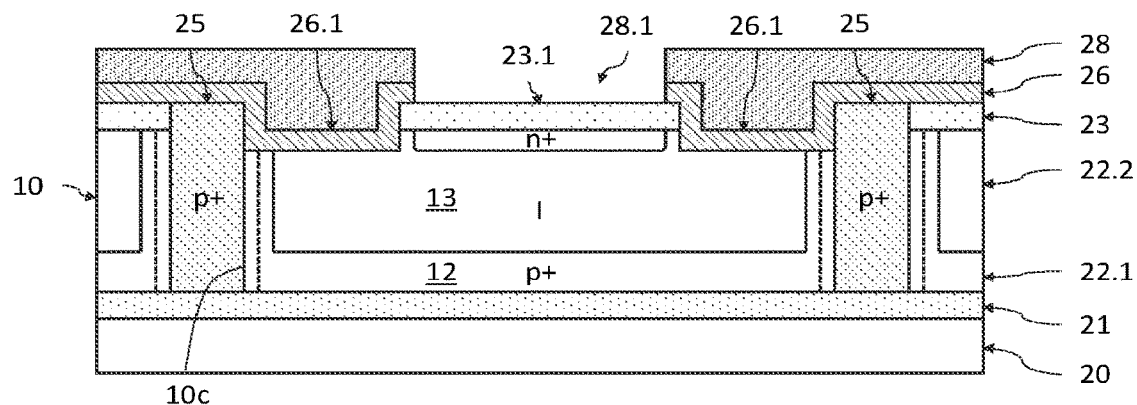

With reference FIG. 2K, n-type doping elements, for example phosphorus, arsenic or antimony (or a combination of these elements), are ion-implanted into the intrinsic germanium of the detection portion 10, through the implantation opening 28.1. The concentration of the doping elements may be between $10^{19}$ and $10^{21}$ at/cm$^3$.

Figure 2L:
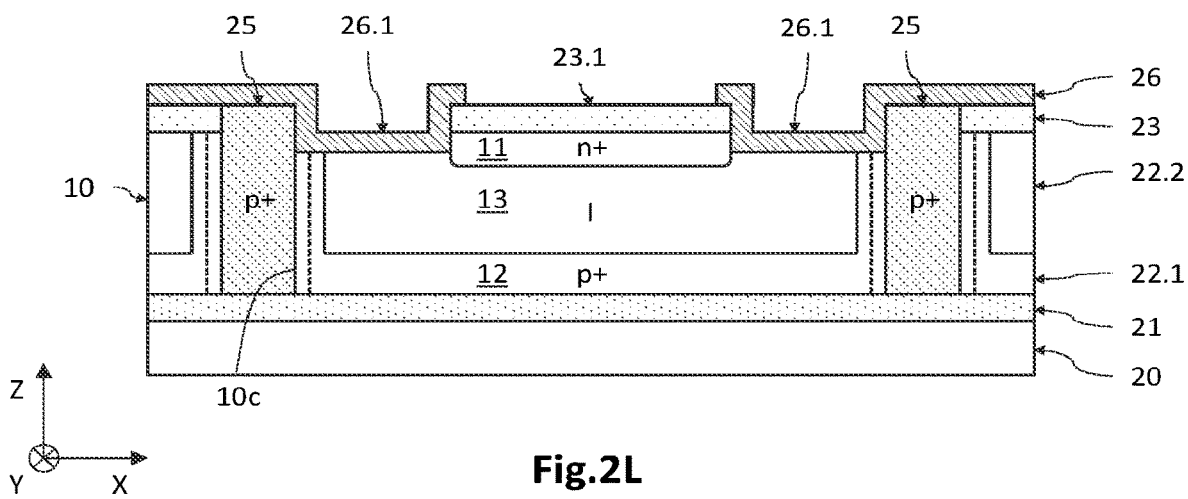

With reference to FIG. 2L, an anneal for diffusion and activation of the doping elements that have been implanted is carried out at a temperature of, for example, between 550° C. and 700° C. for a duration from 5 seconds to 30 seconds. In the case that the depth of implantation of the doping elements is less than the thickness of the ferroelectric layer 26, this then makes it possible to block the lateral diffusion of the doping elements in the direction of the p+-doped semiconductor peripheral portion 25. In any event, what is obtained is an n+-doped first region 11 that has the desired lateral dimensions, and the risk of a short circuit between this n+-doped first region 11 and the p+-doped semiconductor peripheral portion 25 is limited. The photoresist layer 28 is also removed.

Figure 2M:
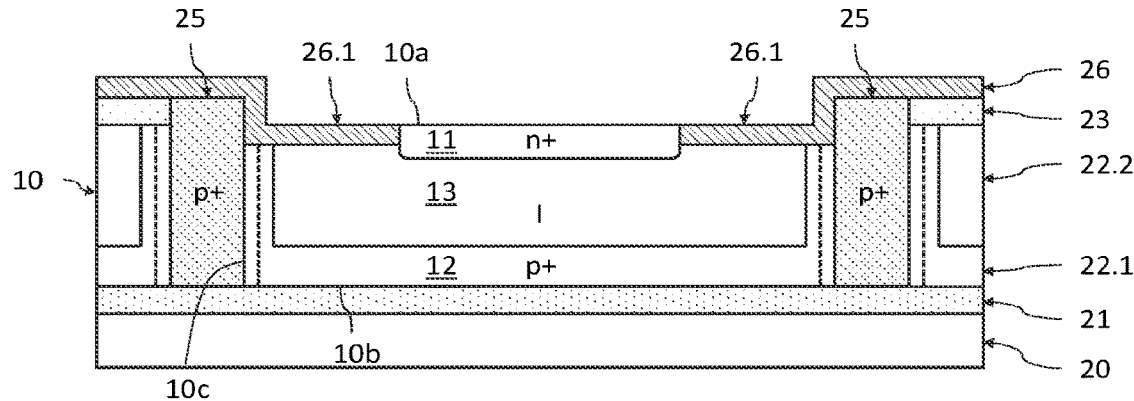

With reference to FIG. 2M, the central portion 23.1 of the upper insulating layer 23 is removed so as to free the upper face of the detection portion 10, corresponding here to that of the n+-doped first region 11. The parts of the ferroelectric layer 26 which were in contact with the central portion are also removed. Next, cleaning of the upper surface of the n+-doped first region 11 may be carried out. This results in the upper face of the ferroelectric peripheral portion 26.1 and the upper face of the n+-doped first region 11 being coplanar here. They together define the first surface 10a, which is opposite the second surface 10b.

Figure 2N:
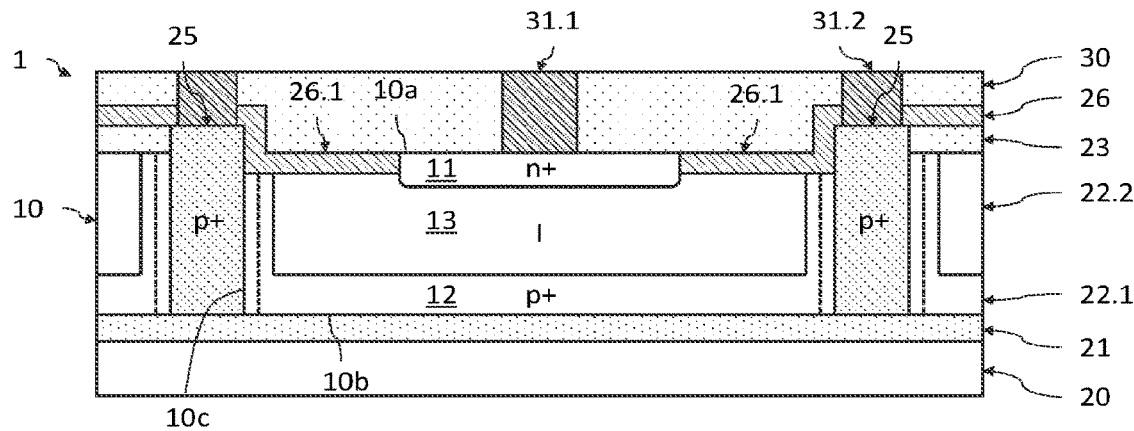

With reference to FIG. 2N, the dielectric layer 30 is deposited so as to cover the optoelectronic stack thus produced on the side of the first surface 10a. This dielectric layer 30 thus extends over and in contact with the ferroelectric layer 26 and with the n+-doped first region 11. It is made of a dielectric material, for example a silicon oxide, silicon nitride or silicon oxynitride, an aluminum oxide or aluminum nitride, a hafnium oxide, inter alia. It may for example have a thickness comprised between 10 nm and 600 nm.

Contact metallizations 31 are then produced, which extend through the dielectric layer 30 and come into contact with the n+-doped first region 11 (for the central metallization 31.1) and in contact with the p+-doped semiconductor peripheral portion 25 (for the lateral metallization 31.2). The contact metallizations 31 may be produced conventionally by filling the through-openings through the dielectric layer 30 with at least one metal material (Ti-based barrier layer, copper core), followed by a CMP planarization step. The dielectric layer 30 and the contact metallizations 31 together have one and the same coplanar upper face.

Figure 2O:
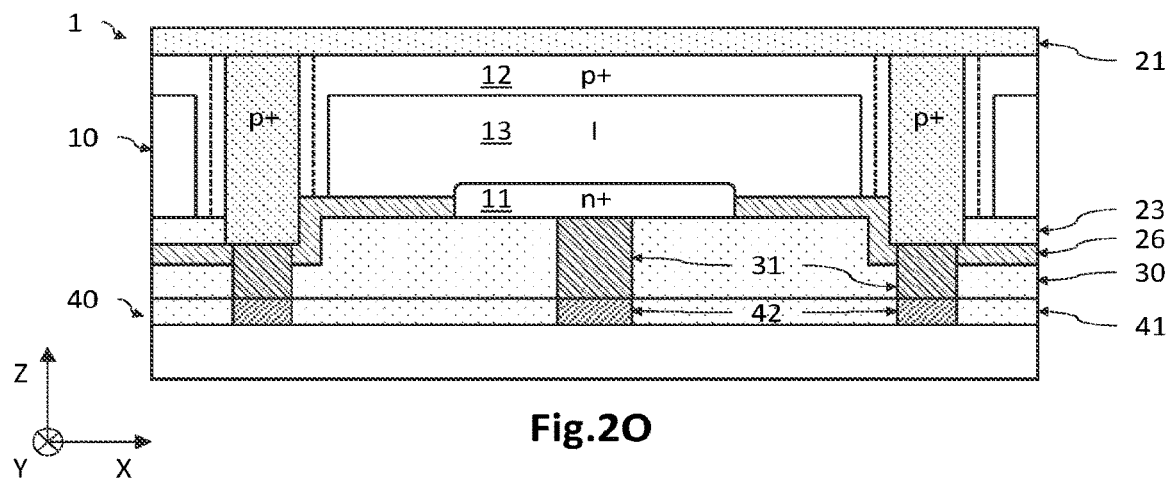

With reference to FIG. 2O, the optoelectronic stack thus obtained is hybridized on a control chip 40. The connection surface of the control chip 40 may thus be coated with an insulating layer 41, made of a dielectric material, through which metallizations 42 pass. The optoelectronic stack and the control chip 40 are thus assembled by hybrid molecular adhesion, through contact between the surfaces formed by the contact metallizations 31, 42 and the insulating layers 30, 41.

Bonding annealing may be performed so as to increase the surface bonding energy between the two surfaces in contact. The support layer 20 is then removed, for example by abrasion (grinding), so as to expose the lower insulating layer 21. This thus forms the reception surface for the light radiation to be detected, and advantageously provides an anti-reflection function.

The production method thus makes it possible to obtain one or more passivated photodiodes 1, each comprising a ferroelectric peripheral portion 26.1 surrounding the n+-doped first region 11 in the XY plane, and located between and in contact with the dielectric layer 30 and with the intermediate region 13. The presence of such a ferroelectric peripheral portion 26.1, when the photodiode 1 is biased, makes it possible to orient the ferroelectric dipoles horizontally, thereby allowing the surface component of the dark current to be reduced, and therefore the performance of the photodiode 1 to be improved.

Figure 3A:
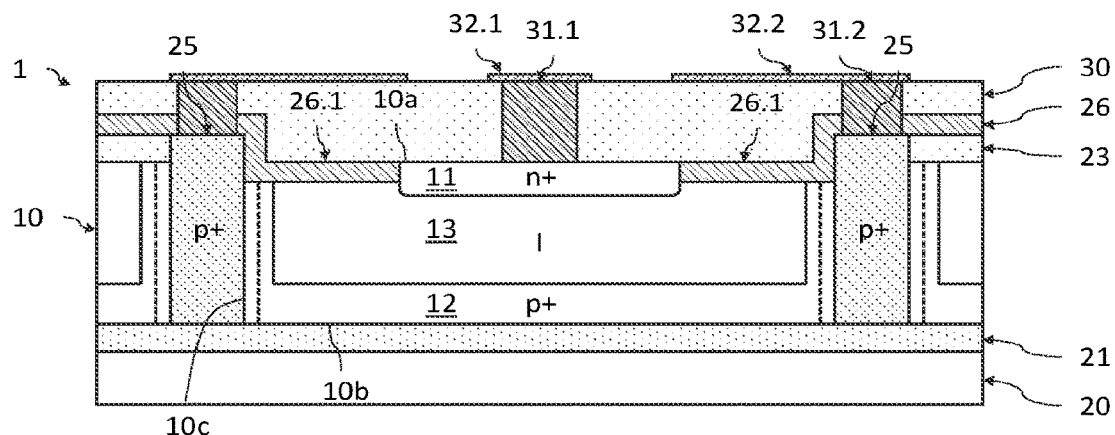
FIGS. 3A to 3C illustrate various steps of a method for producing a photodiode according to the embodiment illustrated in FIG. 1B.
Figure 3B:
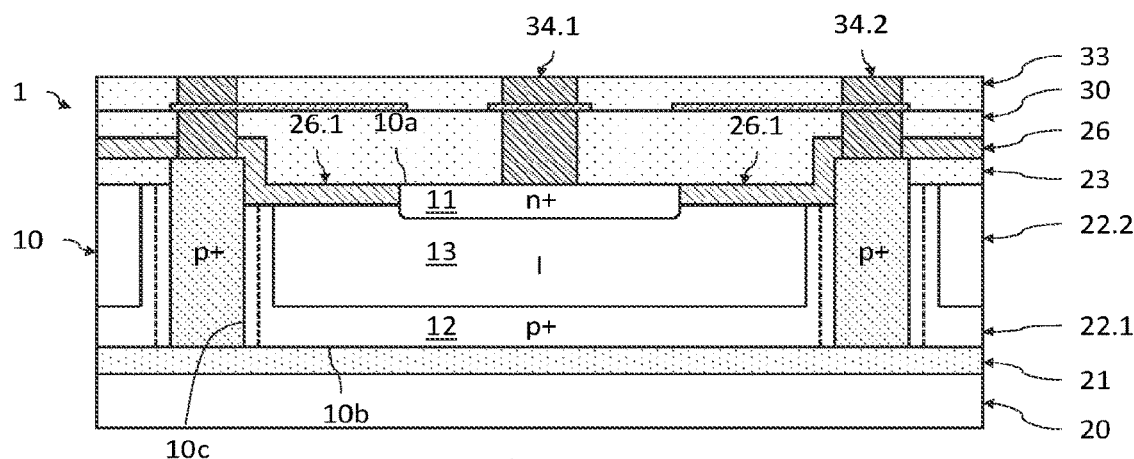
Figure 3C:
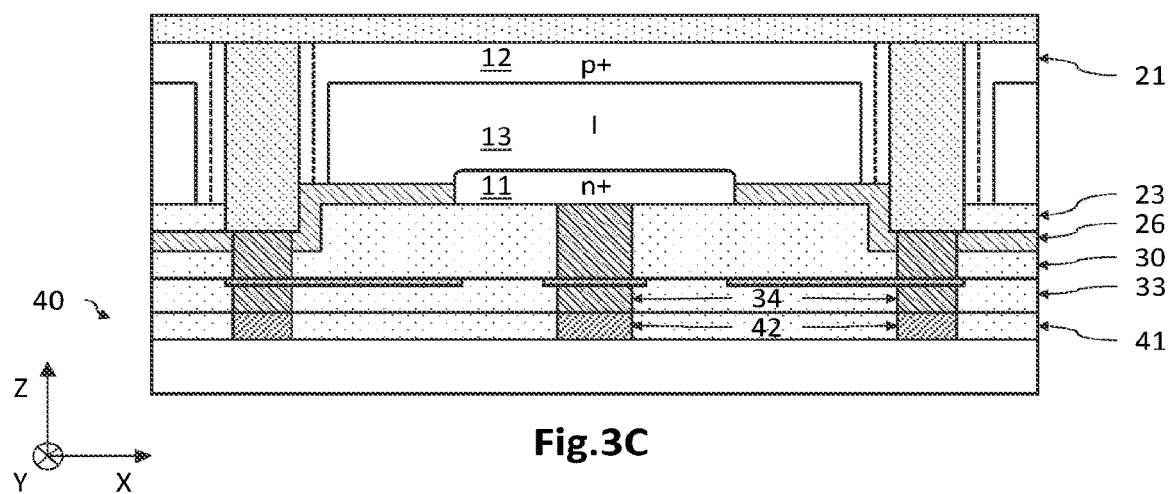

FIGS. 3A to 3C illustrate some steps in a method for producing a photodiode similar to that illustrated in FIG. 1B. In this case, the photodiode 1 comprises planar electrodes that allow the ferroelectric dipoles to be oriented in a vertical direction. The optoelectronic stack obtained in step 2N is considered here.

With reference to FIG. 3A, planar electrodes 32 that come into contact with the metallizations 31, for example based on Ti/TiN, and that have a thickness of the order of about 10 to 40 nm, are produced. Thus, what is produced is a peripheral electrode 32.2 that comes into contact with the peripheral metallization 31.2 and extends, in the XY plane, over the dielectric layer 30 so as to be facing (vertically in line with) the ferroelectric peripheral portion 26.1 and here part of the n+-doped first region 11. A central electrode 32.1 that comes into contact with the central metallization 31.1 is also produced.

With reference to FIG. 3B, a second upper insulating layer 33 is deposited so as to cover the dielectric layer 30 and the planar electrodes 32.1 and 32.2. Second contact metallizations 34.1, 34.2 are produced through the insulating layer 33.

With reference to FIG. 3C, the optoelectronic stack thus obtained is hybridized on a control chip 40. The optoelectronic stack and the control chip 40 are here assembled by hybrid molecular adhesion, through contact between the surfaces formed by the contact metallizations 34, 42 and the insulating layers 33, 41. The support layer 20 is then removed, for example by grinding, so as to expose the lower insulating layer 21.

The production method thus makes it possible to obtain one or more passivated photodiodes 1, each comprising a ferroelectric peripheral portion 26.1 surrounding the n+-doped first region 11, and located at the level of the first surface 10a, therefore in contact with the dielectric layer 30. The presence of such a ferroelectric peripheral portion 26.1, when the photodiode 1 is biased, by virtue of the planar electrode 32.2, makes it possible to orient the ferroelectric dipoles vertically, thereby allowing the surface component of the dark current to be reduced, and therefore the performance of the photodiode 1 to be improved.

Particular embodiments have just been described. Various modifications and variants will be apparent to a person skilled in the art.

The invention claimed is:

1. A photodiode, having a first surface and a second surface that are opposite one another and parallel to a main plane, comprising:
   a detection portion, made of a semiconductor material, comprising:
      a first region that is doped with a first conductivity type and is flush with the first surface, and is configured to be electrically biased;
      a second region that is doped with a second conductivity type opposite the first type, and is flush with the second surface; and
      an intermediate region, located between the first region and the second region;
   a dielectric layer, covering the detection portion on the first surface and coming into contact with the first region;
   a semiconductor peripheral portion made of a semiconductor material doped with the second conductivity type, configured to be electrically biased, and surrounding the detection portion in the main plane and coming into contact with the second region; and
   a ferroelectric peripheral portion, made of a ferroelectric material,
      located between and in contact with the intermediate region and the dielectric layer, and
      located between the first region and the semiconductor peripheral portion and surrounding the first region in the main plane.

2. The photodiode as claimed in claim 1, wherein the ferroelectric peripheral portion is laterally in contact with the first region on one side, and with the semiconductor peripheral portion on the other side.

3. The photodiode as claimed in claim 1, wherein the detection portion has a peripheral indentation delimiting a protruding part surrounded by the ferroelectric peripheral portion in the main plane.

4. The photodiode as claimed in claim 1, wherein the detection portion is based on germanium, and the peripheral semiconductor portion is based on silicon.

5. The photodiode as claimed in claim 1, wherein the ferroelectric peripheral portion is based on a material chosen from among PZT, PLZT, BT, PT, PLT, PVDF, and from among $HfO_2$, ZnO, and AlN.

6. The photodiode as claimed in claim 1, wherein the dielectric layer is passed through by a central metallization that comes into contact with the first region, and by a lateral metallization that comes into contact with the semiconductor peripheral portion.

7. The photodiode as claimed in claim 6, comprising a peripheral electrode extending over the dielectric layer and in contact with the lateral metallization, surrounding the first region, and located vertically in line with the ferroelectric peripheral portion.

8. An optoelectronic device, comprising: the photodiode as claimed in claim 1; and a control chip hybridized with the photodiode, designed to reverse-bias the photodiodes.

* * * * *